May 17, 1966 C. R. PENDRED 3,252,005

NEGATIVE RESISTANCE CIRCUITS UTILIZING TUNNEL RESISTOR

Filed July 3, 1963

INVENTOR.
CHARLES R. PENDRED
BY John V. Regan
Attorney

United States Patent Office 3,252,005
Patented May 17, 1966

3,252,005
NEGATIVE RESISTANCE CIRCUITS UTILIZING TUNNEL RESISTOR

Charles Richard Pendred, Merchantville, N.J., assignor to Radio Corporation of America, a corporation of Delaware Filed July 3, 1963, Ser. No. 292,533
8 Claims. (Cl. 307—88.5)

This invention relates to negative resistance circuits, and more particularly to coupling and switching circuits using negative resistance devices.

A negative resistance device, such as a tunnel diode, functions as an active switching element by virtue of its negative resistance properties. In switching circuits, a tunnel diode may be quiescently biased in one of its positive resistance regions and switched through its negative resistance region to the other positive resistance region by applying an input signal to the tunnel diode. If the tunnel diode is bistably biased, the diode remains in the other positive resistance region and an output signal level is produced. If the tunnel diode is monostably biased, the diode switches back to the one positive resistance region and an output pulse is produced.

The input signals for a tunnel diode switching circuit may, for example, be derived from other similar tunnel diode circuits. The amplitude of such input signals may differ appreciably due to the different characteristics exhibited by different tunnel diodes, the different intercoupling networks utilized, or for other reasons. As a consequence of such input signal variations, erroneous operation of a tunnel diode switching circuit may result.

Accordingly, it is an object of this invention to provide an improved coupling network for negative resistance circuits which increases the reliability of operation.

It is another object of this invention to provide an improved coupling network which applies to a tunnel diode circuit a substantially constant current despite variations in the input signals to the coupling network.

It is a further object of this invention to provide a coupling network which suppresses variations in input signals.

In accordance with the invention, input signals to the negative resistance switching circuit are applied through a nonlinear impedance device. The nonlinear impedance device is selected to have a current-voltage characteristic which includes a region exhibiting a substantially zero dynamic conductance but finite values of static conductance. Such a nonlinear device may, for example, comprise a tunnel resistor which exhibits a predetermined and substantially constant current output over a relatively broad range of applied input voltages.

Input voltage signals applied through a tunnel resistor to the negative resistance circuit may vary appreciably in amplitude but such variations will be suppressed by the substantially zero dynamic conductance of the tunnel resistor. The tunnel resistor provides a substantially constant current output and insures reliable operation of the negative resistance circuit.

Figure 1:
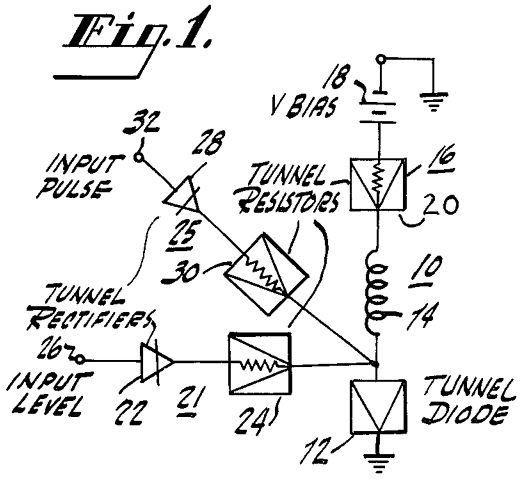
FIGURE 1 is a schematic circuit diagram of a tunnel diode circuit embodying the invention.

Referring now to FIGURE 1, a negative resistance switching circuit 10 which functions as an AND gate is shown. The invention will be described with particular reference to the AND gate 10 although it may be embodied in other forms of switching circuits. The AND gate 10 includes a tunnel diode 12 having a cathode coupled to a point of reference potential, or ground, in the circuit and an anode coupled through an inductor 14 to a biasing supply source 16. The biasing supply 16 includes the series combination of a battery 18 and a tunnel resistor 20. A tunnel resistor is described, for example, in the RCA Technical Manual TD–30, entitled "Tunnel Diodes For Switching And Microwave Applications." The negative potential terminal of the battery 18 is grounded, while the positive potential terminal thereof is coupled through the tunnel resistor 20 and inductor 14 to forward bias the tunnel diode 12.

A first coupling network 21 which comprises the series combination of a tunnel rectifier 22 and a tunnel resistor 24 is coupled between a first input terminal 26 and the anode of the tunnel diode 12. A tunnel rectifier is described, for example, in an article by Lesk et al. appearing in the 1959 IRE Wescon Convention Record, Part III, Page 9. In the article, the tunnel rectifier is referred to as a "backward diode" but the diode has since become more commonly known as a "tunnel rectifier." A second coupling network 25 which comprises the series combination of a tunnel rectifier 28 and a tunnel resistor 30 is coupled between a second input terminal 32 and the anode of the tunnel diode 12.

Figure 2:
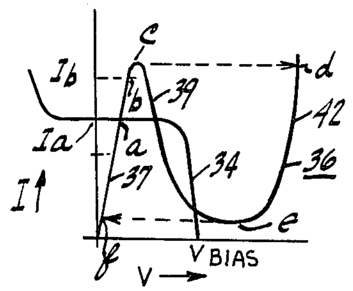
FIGURE 2 is a graph illustrating the current-voltage characteristic of a tunnel diode.

The battery 18 and the tunnel resistor 20 are selected to bias the tunnel diode 12 monostably in its first positive resistance region. As shown in FIGURE 2, the biasing source 16, because it includes the tunnel resistor 20, exhibits a load line 34 which intercepts the tunnel diode characteristic curve 36 at a point such as (*a*) in the first positive resistance region 37. The other two intersections of the load line 34 and the characteristic curve 36 both occur in the negative resistance region 39 of the tunnel diode 12 and hence are unstable operating points. A quiescent biasing current having an amplitude $I_a$ flows through the tunnel diode 12 due to the biasing supply 16, in the absence of any other input signals.

Figure 3:
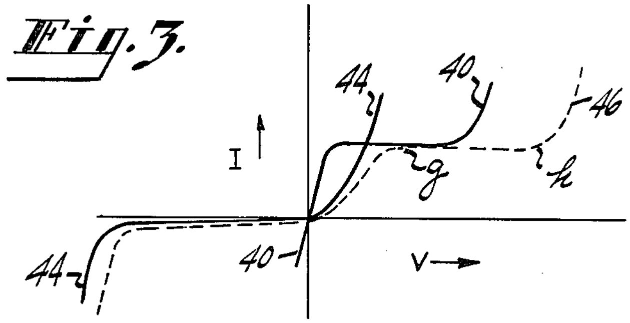
FIGURE 3 is a graph illustrating the individual and composite current-voltage characteristics of a tunnel rectifier and a tunnel resistor.

The normal current-voltage characteristic of a tunnel resistor is similar to that shown by the curve 40 in FIGURE 3. The load line 34 in FIGURE 2 is shown reversed from the characteristic 40 in FIGURE 3 to denote the fact that the tunnel resistor 20 functions as a quiescent load on the tunnel diode 20. A tunnel resistor comprises the combination of a resistor shunted across the terminals of a tunnel diode and both encapsulated in the same package. A tunnel resistor exhibits a substantially constant current over a relatively broad region of its current-voltage characteristic. The magnitude of the constant current region is determined by the peak current point (such as the point (*c*) in FIGURE 2) of the tunnel diode in the package. The inclusion of the tunnel resistor 20 in the biasing supply 16 effectively transforms the biasing supply into a current biasing source.

To produce an output signal, the AND gate 10 requires the simultaneous application of input signals to the first and second input terminals 26 and 32. The input signal at the first input terminal 26 may, for example, comprise an input voltage level. Such an input voltage level may, for example, be derived from a bistably biased tunnel diode switching circuit operating in its second positive resistance or high voltage region, such as the region 42 in FIGURE 2. The input signal to the second input terminal 32 may, for example, comprise an input voltage pulse derived from a tunnel diode when the diode is caused to be switched forth and back through its negative resistance region, such as from the point (*c*) to the point (*d*) and from the point (*e*) to the point (*f*) in FIGURE 2.

The tunnel rectifiers 22 and 28 are included in the coupling networks 21 and 25, respectively, to introduce unidirectionality into the basically bidirectional tunnel diode circuit 10. The tunnel rectifiers 22 and 28 exhibit a low resistance to current flow in one direction and an extremely high resistance to current flow in the other direction, as shown by the curve 44 in FIGURE 3. The rectifiers 22 and 28 are poled in the AND gate 10 of FIGURE 1 to prevent current from flowing from the biasing supply 16 back to the preceding stages and hence provide unidirectional signal coupling in the circuit. Similarly, the coupling tunnel resistors 24 and 30, as well as the biasing tunnel resistor 20, are also poled in the AND gate 10 to provide forward current flow therethrough.

The composite characteristic of the series combination of a tunnel rectifier and a tunnel resistor is shown by the dotted curve 46 in FIGURE 3. It is to be noted that over the region from (*g*) to (*h*), the composite characteristic 46 exhibits a substantially zero dynamic conductance but finite values of static conductance. The zero dynamic conductance throughout this region suppresses any variations in applied voltages to provide a substantially constant current output. It is this characteristic which is utilized in a coupling network to provide reliable operation of a tunnel diode switching circuit.

In operation, the biasing supply 16 causes a quiescent current of $I_a$ to flow through the tunnel diode 12. The application of an input voltage signal level to the input terminal 26 causes an increased current through the diode 12 such that the sum of the quiescent current nad applied signal current equals $I_b$. The biasing tunnel resistor 20 prevents any significant amount of signal current from flowing through the biasing supply 16.

It is to be noted that the total current $I_b$ through the diode 12 causes the diode to operate at the point (*b*) which is very close to the peak current point (*c*) of the diode characteristic 36. Once the diode exceeds the current peak point (*c*), it will switch through the negative resistance region and produce an output. Thus, it is important that the diode 12 be reliably maintained at the point (*b*) in order to prevent erroneous operation. Any normal variations in input signal voltage levels are suppressed by the zero dynamic conductance of the tunnel resistor 24 so that the diode 12 remains at the point (*b*).

The further application of an input signal voltage pulse to the second terminal 32 causes the diode 12 to switch through the negative resistance region and then back to provide a pulse output. The biasing tunnel resistor 20 decreases the recovery time from the point (*f*) to the point (*a*).

The coupling tunnel resistor 30 in the coupling network 25 provides a constant amplitude signal current pulse to switch the diode 12. Therefore, the tunnel resistor coupling network may be utilized with a pulse input, a signal level input, or a combination of both.

What is claimed is:

1. A coupling network for applying input signals to a negative resistance device comprising the combination of,
   a tunnel resistor coupled to said negative resistance device, and
   means for applying input signals to said negative resistance device through said tunnel resistor.

2. An electrical circuit comprising in combination,
   a negative resistance device having a current-voltage characteristic exhibiting a pair of positive resistance regions separated by a dynamic negative resistance region,
   a source of input signals for causing said device to switch through said negative resistance region, and
   a tunnel resistor connected between said source of input signals and said device.

3. A coupling network for applying input signals from a source of signals to a tunnel diode comprising the combination of,
   an input terminal coupled to said source of signals, an output terminal coupled to said tunnel diode, and
   a tunnel resistor and a tunnel rectifier connected in series between said input and output terminals.

4. An electrical circuit for coupling input signals to a tunnel diode comprising the combination of,
   an impedance device having a current-voltage characteristic which includes a region of substantially zero dynamic conductance,
   means for applying to said impedance device input signals having an amplitude which causes said impedance device to operate in said region of substantially zero dynamic conductance,
   said input signals being subject to variations in amplitude, and
   means coupling said impedance device to said tunnel diode to apply to said tunnel diode input signals from which the variations in amplitude have been suppressed.

5. A coupling network for applying input signals from a source of signals to a tunnel diode comprising the combination of,
   a tunnel resistor having a pair of terminals,
   means connecting one of said pair of terminals to said source of input signals, and
   means connecting the other of said pair of terminals to said tunnel diode.

6. An electrical circuit comprising in combination,
   a tunnel diode exhibiting a current-voltage characteristic including a pair of positive resistance regions separated by a dynamic negative resistance region,
   means including the series combination of a source of potential and a tunnel resistor for biasing said tunnel diode to quiescently operate in one of said positive resistance regions,
   a source of input signals, and
   a tunnel resistor connected between said source of input signals and said tunnel diode for applying said input signals to cause said tunnel diode to switch through said dynamic negative resistance region.

7. An electrical circuit comprising in combination,
   a tunnel diode exhibiting a current-voltage characteristic including a pair of positive resistance regions separated by a dynamic negative resistance region,
   means including the series combination of a source of potential and a tunnel resistor for biasing said tunnel diode to quiescently operate in one of said positive resistance region,
   a source of input signals, and
   a tunnel resistor and a tunnel rectifier connected in series between said source of input signals and said tunnel diode for applying said input signals to cause said tunnel diode to switch through said dynamic negative resistance region.

8. An electrical circuit comprising in combination,
   a tunnel diode exhibiting a current-voltage characteristic including a pair of positive resistance regions separated by a dynamic negative resistance region,
   means incluuding the series combination of a source of potential and a tunnel resistor for biasing said tunnel diode to quiescently operate in one of said positive resistance regions,
   a source of input signals, and
   a tunnel resistor and a tunnel rectifier poled for forward conduction and connected in series between said source of input signals and said tunnel diode for applying said input signals to cause said tunnel diode to switch through said dynamic negative resistance region.

No references cited.

ARTHUR GAUSS, *Primary Examiner.*

J. BUSCH, *Assistant Examiner.*